United States Patent [19]

Ogawara

[11] 3,956,713
[45] May 11, 1976

[54] ASTABLE MULTIVIBRATOR HAVING ADJUSTABLE PULSE WIDTH AT CONSTANT FREQUENCY

[75] Inventor: Yoshiaki Ogawara, Inagi, Japan
[73] Assignee: Sony Corporation, Tokyo, Japan
[22] Filed: Dec. 17, 1974
[21] Appl. No.: 533,549

[30] Foreign Application Priority Data
Dec. 24, 1973 Japan.................................. 48-3148

[52] U.S. Cl. ............................. 331/113 R; 331/144
[51] Int. Cl.² ......................................... H03K 3/282
[58] Field of Search............ 331/113 R, 144; 332/14

[56] References Cited
UNITED STATES PATENTS
3,445,788  5/1969  Camenzind ..................... 331/113 R
3,483,479  12/1969  Harshbarger................. 331/113 R X
3,560,878  2/1971  Wickliff .......................... 331/113 R Primary Examiner—Siegfried H. Grimm
Attorney, Agent, or Firm—Lewis H. Eslinger; Alvin Sinderbrand

[57] ABSTRACT

An astable multivibrator circuit having an adjustable pulse width but constant frequency, including a pair of active elements such as transistors for being switched on and off alternately and reciprocally, and a control circuit associated therewith for controlling the multivibrator circuit to derive therefrom a controlled output pulse signal, the pulse width of which is varied without changing the frequency thereof.

10 Claims, 9 Drawing Figures

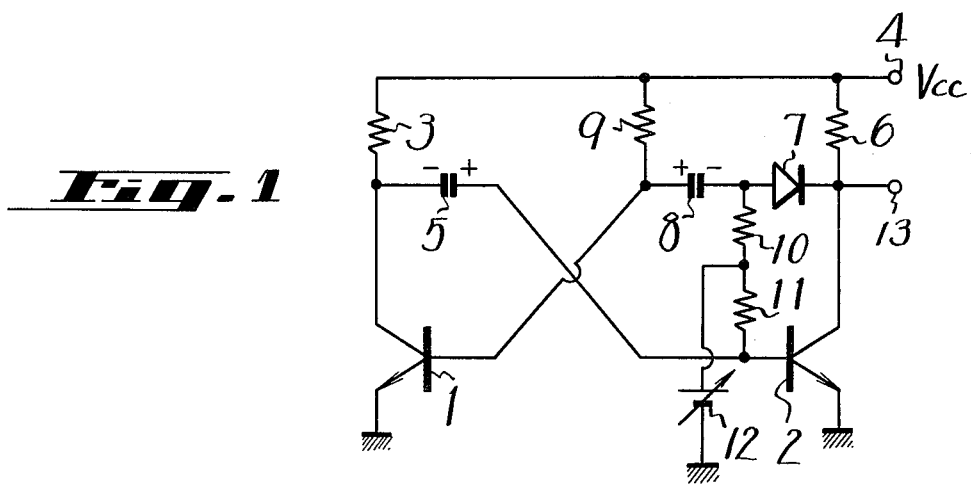
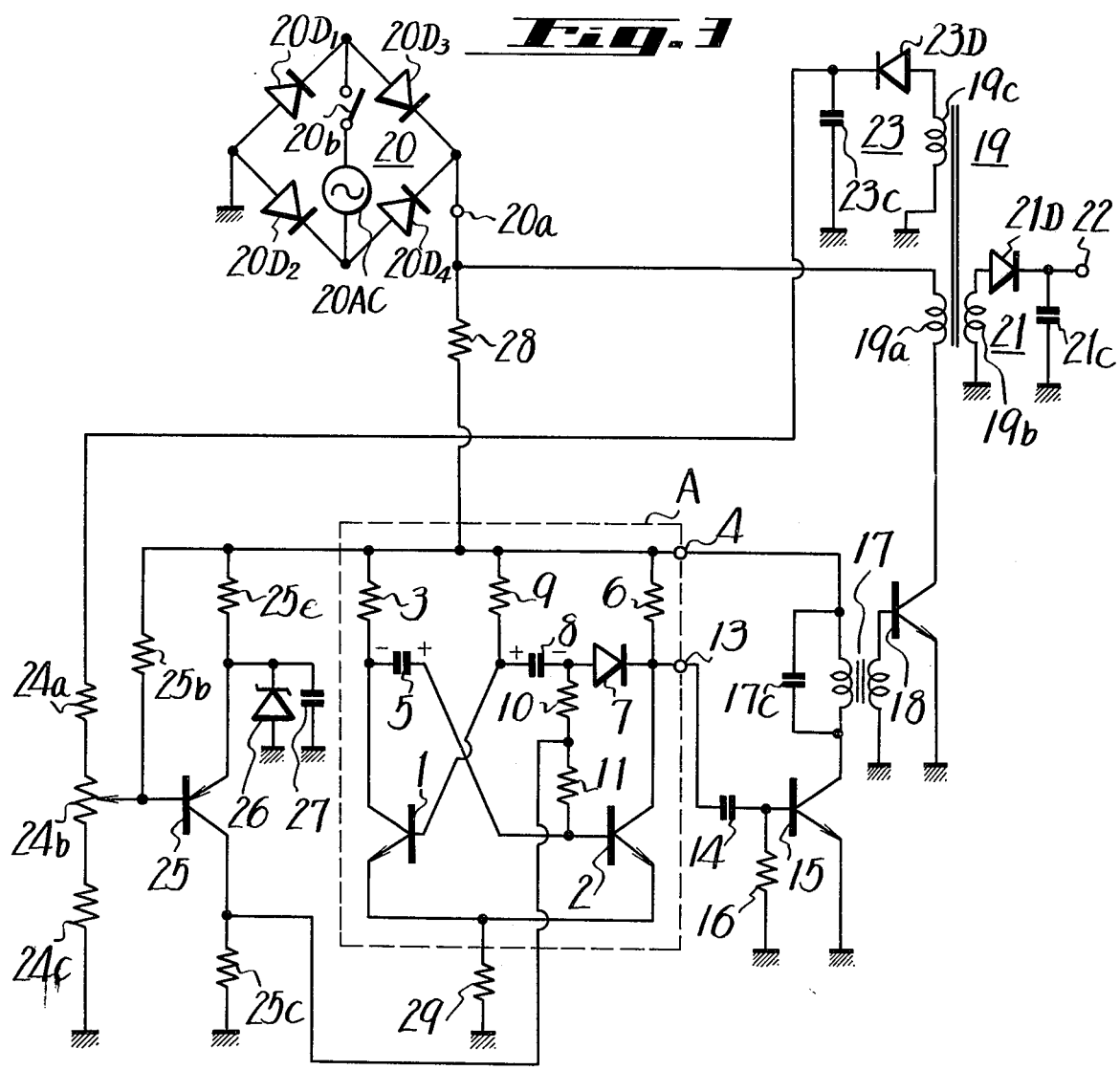

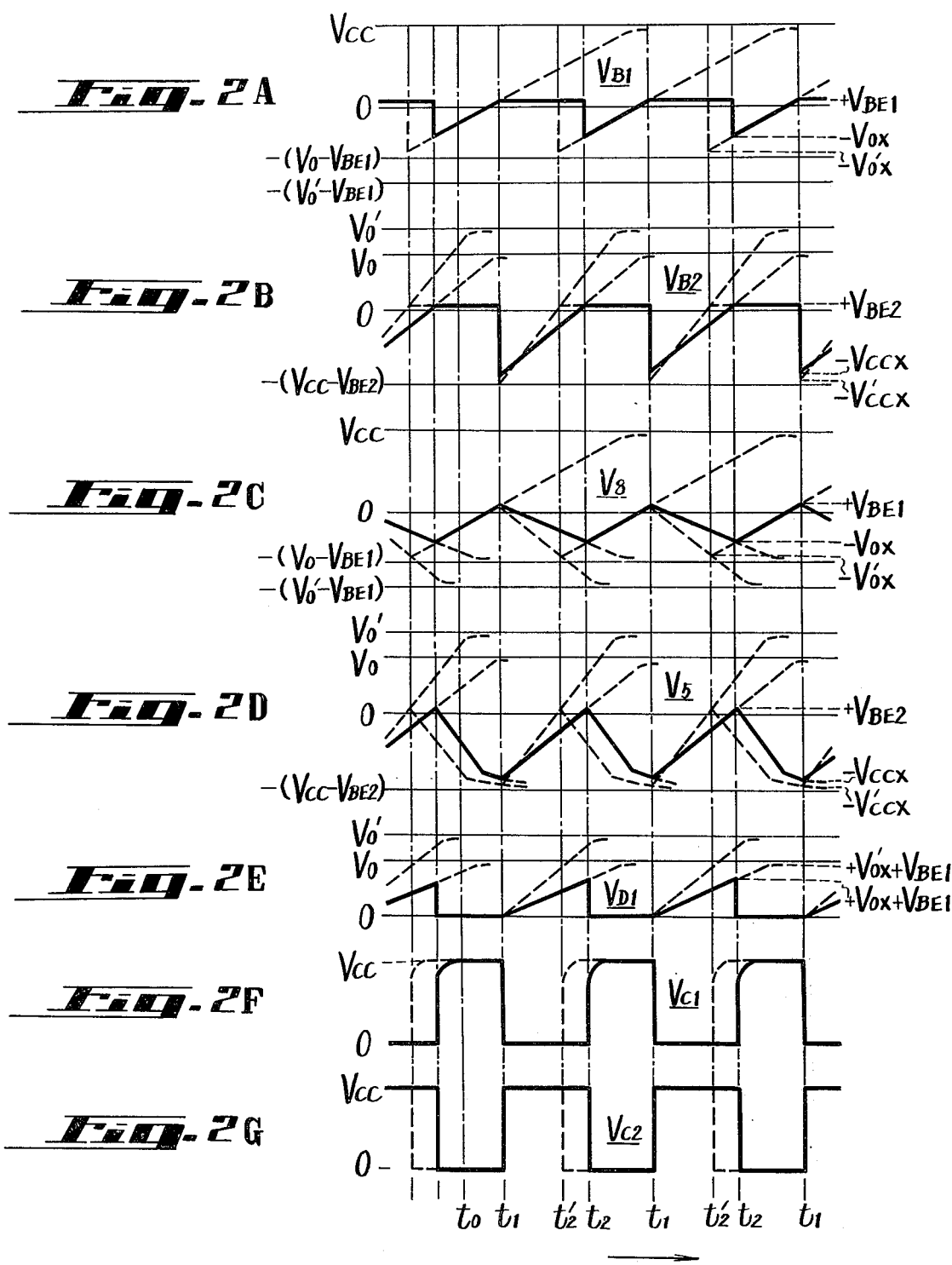

ASTABLE MULTIVIBRATOR HAVING ADJUSTABLE PULSE WIDTH AT CONSTANT FREQUENCY

BACKGROUND OF THE INVENTION

1. Field of the Invention

This invention relates generally to an astable multivibrator circuit and more particularly to such a circuit readily adopted to be used in the so-called "chopping" type DC power supply circuit.

2. Description of the Prior Art

An astable multivibrator circuit is well known in the art as a square wave generator or oscillator. This circuit finds use in many different kinds of electric devises and systems. A conventional astable multivibrator circuit usually includees a pair of active elements such as transistors, electron tubes and the like which are switched on and off alternately and reciprocally. Output signals of square or rectangular waveform are obtained from either or both of the active elements.

Such an astable multivibrator circuit is often utilized as a voltage level controlling circuit in the so-called "chopping" type DC power supply circuit. In this type of power supply circuit, the astable multivibrator circuit is controlled to produce an output pulse signal of variable pulse width for driving a chopping switcher, so as to stabilize an output DC voltage from the power supply circuit.

However, when the conventional astable multivibrator circuit is controlled to produce an output signal of variable pulse width, the frequency of the output signal usually is subjected to a concurrent change. This change in the frequency of the output signal is usually undesired, especially when the astable multivibrator circuit is utilized in the "chopping" type DC power supply circuit. In particular, frequency changes cause an increase in the power loss of switching devices, transformers, etc. included in the power supply circuit, with the strong possibility that the switching devices are apt to overheat resulting in damage and even destruction thereof If this type of conventional power supply circuit is used in a television receiver, the change in the frequency of the output signal form the astable multivibrator can deleteriously affect the quality of the video picture reproduced on the screen of the cathode ray tube of the television receiver.

OBJECTS OF THE INVENTION

Accordingly, it is an object of the invention to provide a novel and improved astable multivibrator circuit avoiding the disadvantages inherent in the prior art.

Another object of the invention is to provide a novel astable multivibrator circuit which is controlled to derive a pulse output signal, the pulse width of which is controlled while the frequency of which is maintained substantially constant.

A further object of the invention is to provide a controllable astable multivibrator circuit which is simple in construction and is readily adapted to be used as a level control circuit in the so-called "chopping" type DC power supply circuit.

SUMMARY OF THE INVENTION

The astable multivibrator circuit according to the present invention includes first and second active elements each having control, common and output electrodes, the output and common electrodes of the first and second active elements are respectively connected between a pair of power supply voltage terminals.

A first capacitor is connected between the output electrode of the first active element and the control electrode of the second active element and a series connection of a diode and a second capacitor is connected between the output electrode of the second active element and the control electrode of the first active element.

A pair of resistors is connected between the control electrode of the second active element and a connection point between the diode and the second capacitor, and a variable Dc control voltage is applied to the connection point between the pair of resistors.

In accordance with the foregoing circuit construction, an output signal of controlled pulse width is obtained from the output electrode of the first or second active element without changing the frequency of the output signal.

This invention may be better understood when the following detail description is read in connection with the accompanying drawings.

BRIEF DESCRIPTION OF THE DRAWINGS

FIG. 1 is a circuit diagram showing an embodiment of the astable multivibrator according to the present invention.

FIGS. 2A-2G are waveform diagrams which are useful in understanding the operation of the circuit of FIG. 1.

FIG. 3 is a circuit diagram showing one application of the astable multivibrator circuit according to the present invention.

DESCRIPTION OF THE PREFERRED EMBODIMENT

An embodiment of the astable multivibrator according to the present invention will be hereinafter described with reference to FIG. 1. In the figure, reference numerals 1 and 2 indicate NPN-type transistors, respectively, which are used as first and second active elements. Alternatively, other active elements, such as electron tubes, or devices such as switching elements, can be used. The common electrode or emitter electrode of the transistor 1 is coupled to a reference potential, such as ground, and its output electrode or collector electrode is connected through a resistor 3 to a power supply voltage terminal 4 which is supplied with a DC voltage $V_{cc}$, for example, 12V. The output electrode is further coupled through a capacitor or condenser 5 to the control electrode or base electrode of the transistor 2. The emitter electrode of the transistor 2 is grounded and its output or collector electrode is connected through a resistor 6 to the voltage source terminal 4 and also to the cathode electrode of a unidirectional current conducting device, such as diode 7. The anode of the diode 7 is connected through a capacitor or condenser 8 to the base electrode of the transistor 1. The connection point between the base electrode of the transistor 1 and the capacitor 8 is connected through a resistor 9 to the power supply voltage terminal 4. The connection point between the diode 7 and the capacitor 8 is connected through a series connection of resistors 10 and 11 to the base electrode of the transistor 2. The positive electrode of a variable control voltage supply source 12 of, for example, about 6V, is connected to the connection point between the resistors 10 and 11 and the negative electrode thereof is grounded. An output terminal 13 is provided at the collector electrode of the transistor 2. Alternatively an output terminal can be provided at the collector electrode of the transistor 1.

The operation of the circuit shown in FIG. 1 will now be described with reference to FIGS. 2A to 2G which show some of the waveforms occurring at respective points of the circuit. In this case, in the interest of simplification and brevity, it is assumed that the saturation voltages between the emitter-collector electrodes of the transistors 1 and 2 are zero when the transistors are conductive and the forward voltage drop across the doide 7 also is zero when it is conducting.

FIGS. 2A and 2B represent waveforms of the base voltages $V_{B1}$ and $V_{B2}$ of the transistors 1 and 2, respectively; FIGS. 2C and 2D represent waveforms of the voltages $V_8$ and $V_5$ across the capacitors 8 and 5, respectively; FIG. 2E represents a waveform of the voltage $V_{D1}$ at the anode electrode of the diode 7; and FIGS. 2F and 2G represent waveforms of the collector voltages $V_{C1}$ and $V_{C2}$ of the transistors 1 and 2, respectively. As will be described later, in FIGS. 2A to 2G, the waveforms shown in solid lines are those when the voltage of the control voltage supply source 12 is $V_0$ and the waveforms shown in broken lines are those when the voltage of the control voltage supply source 12 is $V_0'$ which is higher than $V_0$.

For the following description of the operation of the circuit shown in FIG. 1, let it be assumed that the voltage of the control voltage supply source 12 is $V_0$. The voltages $V_8$ and $V_5$ across the capacitors 8 and 5 are shown in FIGS. 2C and 2D, respectively, when their polarities are as shown in FIG. 1 by the signs + and −. By way of example, at a time $t_o$ the base voltage $V_{B2}$ of the transistor 2 is positive as shown in FIG. 2B, so that the transistor 2 is conductive. If the voltage $V_8$ across the capacitor 8 is negative aatt the time $t_0$ as shown in FIG. 2C, the base voltage $V_{B1}$ of the transistor 1 is negative as shown in FIG. 2A and, accordingly, the transistor 1 is non-conductive. Since the transistor 2 is conductive at this time $t_0$, the capacitor 8 is charged through a circuit including the power supply voltage terminal 4, the resistor 9, the capacitor 8, the diode 7, the collector-emitter path of the transistor 2 and ground. Consequently, the voltage $V_8$ across the capacitor 8 increases toward the level $V_{CC}$ of the power supply voltage and reaches a value $V_{BE1}$ at about the time $t_1$, as shown in FIG. 2C. At this valve the transistor 1 now is made conductive at time $t_1$ with the result that the collector voltage $V_{C1}$ of the transistor 1 is lowered abruptly from the positive voltage $V_{CC}$ to zero (in potential) as shown in FIG. 2F.

At the same time during this period from the time $t_0$ to time $t_1$, the capacitor discharges through a circuit including the terminal 4, resistor 3, capacitor 5, the base-emitter path of the transistor 2 and ground, as shown FIG. 2D. Hence, at the time $t_1$, the voltage $V_5$ across the capacitor 5 decreases to a value $-V_{CCX}$; the voltage value of $V_{CCX}$ being somewhat smaller than that of $(V_{CC}-V_{BE2})$. Now, when the transistor 1 is made conductive at the time $t_1$, as described above, the collector voltage $V_{C1}$ of the transistor 1 is lowered abruptly to zero, and the base voltage $V_{B2}$ of the transistor 2 also is lowered abruptly from $V_{BE2}$ to $-V_{CCX}$ as shown in FIG. 2B. As a result thereof, the transistor 2 is made non-conductive and the collector voltage $V_{C2}$ thereof rises abruptly from zero to $V_{CC}$ as shown in FIG. 2G. Therefore the diode 7 is reversely biased and made non-conductive.

When the transistor 1 is made conductive and the diode 7 is made non-conductive at the time $t_1$, the capacitor 8 discharges through a circuit including the positive electrode of the control voltage source 12, resistor 10, capacitor 8, base-emitter path of transistor 1 and the negative electrode of the voltage source 12. Accordingly, the anode voltage $V_{D1}$ of the diode 7 increases toward the level of the control voltage $V_0$, as shown in FIG. 2E. It is appreciated that the anode voltage $V_{D1}$ of the diode 7 is maintained zero when the transistor 2 is conductive.

When the transistors 1 and 2 are made conductive and non-conductive at the time $t_1$, respectively, the capacitor 5 begins to charge through a loop including the positive terminal of the control voltage source 12, resistor 11, capacitor 5, collector-emitter path of transistor 1 and the negative terminal of the control voltage source 12. Consequently the voltage across the capacitor $V_5$ increases toward the level of the control voltage $V_0$ as shown in FIG. 2D. At a time $t_2$, the voltage $V_5$ across the capacitor 5 reaches the value $V_{BE2}$ which is sufficient to turn on the transistor 2. When the transistor 2 is made conductive, its collector voltage $V_{C2}$ is lowered abruptly from the voltage $V_{CC}$ to zero as shown in FIG. 2G.

During this period from $t_1$ to $t_2$, the capacitor 8 continues to discharge as shown in FIG. 2C, thereby the voltage $V_8$ across it becomes negative until value$-V_{0X}$ is reached at the time $t_2$, where the value $V_{0X}$ is smaller than that of $(V_0 - V_{BE1})$. Thus, when the transistor 2 is made conductive, the base voltage $V_{B1}$ of the transistor 1 is lowered abruptly from the voltage $V_{BE1}$ to the voltage $-V_{0X}$ as shown in FIG. 2A and the transistor 1 is made non-conductive.

The operation described above will be repeated in the astable multivibrator circuit according to the invention so that the pulse signals shown in FIGS. 2F and 2G produced at the collector electrodes of the transistors 1 and 2, respectively, recur.

As may be apparent from a comparison of FIG. 2F with FIG. 2G, the rising edge of the waveform of the collector voltage $V_{C2}$ of the transistor 2 is sharper than that of the waveform of the collector voltage $V_{C1}$ of the transistor 1. This difference between the collector voltages $V_{C1}$ and $V_{C2}$ is caused by the fact that, upon a transition of the transistor 1 from its conductive state to its non-conductive state, its collector voltage $V_{C1}$ is not immediately increased to the voltage $V_{CC}$ due to the influence of the capacitor 5 however, upon a transition of the transistor 2 from its conductive state to its non-conductive state, since the diode 7 is also made non-conductive and the collector electrode of the transistor 2 is thus disconnected from the capacitor 8, the collector voltage $V_{C2}$ of the transistor 2 is increased to the voltage $v_{CC}$ immediately. Therefore, it may be preferable to derive the output pulse signal from the collector electrode of the transistor 2 rather than from that of the transistor 1.

In the following description of the operation of the circuit shown in FIG. 1 it will be assumed that the voltage of the control voltage source 12 has, for example, a value $V'_0$ which is greater than $V_0$. For this condition, the waveforms shown by broken lines in FIGS. 2A to 2G illustrate the circuit operation.

When the voltage of the control voltage source 12 is $V_0'$, the voltages applied to the charging circuit of the capacitor 5 and to the discharging circuit of the capacitor 8 described above increase, respectively. As a result, the time required to charge the capacitor 5 decreases, i.e., its charging speed increases and the slope of the leading edge of the voltage $V_5$ across the capacitor 5 is greater as shown by the broken line in FIG. 2D. Consequently, the slope of the leading edge of the base voltage $V_{B2}$ of the transistor 2 becomes greater, as shown by the broken line in FIG. 2B, so that the time required for the base voltage $V_{B2}$ of the transistor 2 to reach the base-emitter voltage $V_{BE2}$, necessary for making the transistor 2 conductive, now is shorter. Therefore, the transistor 2 is made conductive at a time $t_2'$ before the time $t_2$. When the capacitor 8 is discharged, the time required for discharge is reduced, i.e., its discharging speed becomes fast and the slope of the trailing edge of the voltage $V_8$ across the capacitor 8 is greater as shown in FIG. 2C by the broken line. Accordingly, the base voltage $V_{B1}$ of the transistor 1 is lowered to $-V_{OX}'$ at the instance when the transistor 1 is made non-conductive as shown in FIG. 2A by the broken line, where $V_{OX}'$ is smaller than $(V_O' - V_{BE1})$. Therefore, the time required for the base voltage $V_{B1}$ of the transistor 1 to reach the base-emitter voltage $V_{BE1}$, necessary for making the transistor 1 conductive, now is longer.

As may be understood from FIGS. 2A and 2B, the conduction time period of the transistor 1 is shortened and its non-conduction time period is lengthened, while the non-conduction time period of the transistor 2 is shortened and its conduction time period is lengthened.

In accordance with the teachings of the present invention, the resistance values of the resistors 3, 9, 10 and 11 and the capacitance values of the capacitors 5 and 8 are readily selected so that for the condition where the voltage of the control voltage source 12 in increased, the amount of decrease in the conduction time period of the transistor 1 is made substantially equal to the amount of increase in its non-conecduction time period and, similarly, the amount of decrease in the non-conduction time period of the transistor 2 is substantially equal to the amount of increase in its conduction time period. Thus, it is seen that where the voltage of the control voltage source 12 is varied, the time required for the base voltage $V_{B1}$ of the transistor 1 to change from a non-conducting voltage to the base-emitter conducting voltage $V_{BE1}$ is made substantially equal to the time required for the base voltage $V_{B2}$ of the transistor 2 to change from a non-conducting voltage to the base-emitter conducting voltage $V_{BE2}$.

Accordingly, when the voltage of the control voltage source 12 is increased, a pulse signal whose pulse width is narrowed, as shown in FIG. 2G, is obtained at the collector electrode of the transistor 2. Conversely, when the voltage of the control voltage source 12 is reduced, a pulse signal whose frequency remains constant but whose pulse width is widened is obtained at the collector electrode of the transistor 2.

As described above, the astable multivibrator circuit of the present invention is simple in its circuit construction and provides an oscillator circuit having a constant frequency of oscillation and a controllable pulse width. Thus, the astable multivibrator circuit of the present invention is preferred for use with the so-called "chopping" type DC power supply circuit.

FIG. 3 shows a practical example in which the astable multivibrator circuit of the invention is used as a pulse width modulation (PWM) circuit of the "chopping" type DC power supply circuit, and in which the elements corresponding to those used in FIG. 1 are identified by the corresponding reference numerals and their description will be omitted in the interest of brevity.

In FIG. 3, the astable multivibrator circuit of the invention is enclosed by the block A. The output terminal 13 coupled to the collector electrode of the transistor 2 in the astable multivibrator circuit A is connected through a capacitor 14 to the base electrode of a first switching transistor 15 of NPN-type whose base electrode is coupled to ground through a resistor 16 and whose emitter electrode is coupled directly to ground. The collector electrode of the transistor 15 is connected to the primary winding of a first transformer 17 whose secondary winding is connected to the base electrode of a second switching transistor 18 of NPN-type. The primary winding of the transformer 17 is connected in parallel with a capacitor 17c. The emitter electrode of the transistor 18 is coupled to ground and its collector electrode is connected to one end of a primary winding 19a of a second or output transformer 19. The other end of the primary winding 19a is connected to an output terminal 20a of a DC power supply circuit 20. The secondary winding 19b of the output transformer 19 is connected to a DC output terminal 22 through a rectifier circuit 21 which includes a diode 21D and a capacitor 21C.

A tertiary winding 19c is provided in the output transformer 19. A voltage induced across the tertiary winging 19c is rectified by a rectifier circuit 23 which includes a diode 23D and a capacitor 23C and is used to derive a control voltage for the astable multivibrator circuit A. The output terminal of the rectifier circuit 23 is coupled to ground through a voltage divider network consisting of a resistor 24a, a variable resistor 24b and a resistor 24c. If the rectifier circuits 21 and 23 are similar, the voltage divider network will detect a voltage corresponding to the DC voltage obtained at the DC output terminal 22. The voltage detected by the voltage divider network is supplied through the movable tap of the variable resistor 24b to the base electrode of a PNP-type transistor 25 which is used as an error amplifier. The base electrode of the transistor 25 is connected through a resistor 25b to the power supply voltage terminal 4 and its collector electrode is coupled to ground through a resistor 25c. The emitter electrode of the transistor 25 is connected through a resistor 25e to the power supply voltage terminal 4 and to ground through a parallel connection of a Zener diode 26 and a capacitor 27. The Zener diode 26 serves to hold the emitter voltage of the transistor 25 at a constant value or reference value. A voltage is produced at the collector electrode of the transistor 25 which corresponds to the difference between the reference voltage and the DC output voltage obtained at the DC output terminal 22. The collector voltage of the transistor 25 is applied to the connection point between the resistors 10 and 11 of the astable multivibrator circuit A and is used as the control voltage previously described in respect of the variable control voltage source 12.

The DC power supply circuit 20 includes a so-called "bridge type" rectifying circuit consisting of four diodes $20_{D1}$ to $20_{D4}$, and an AC power source $20_{AC}$ connected through a switch $20_b$ to the bridge circuit. The output terminal 20a of the DC power supply circuit 20 is connected through a resistor 28 to the power supply voltage terminal 4 of the astable multivibrator circuit A. The resistance value of the resistor 28 is selected so as to start the oscillation of the astable multivibrator circuit A when the power supply circuit 20 is switched on. An example of such a resistance value is about 47 KΩ. In the example of FIG. 3, a resistor 29 connected between ground and the emitter electrodes of the transistors 1 and 2 serves as a resistor for temperature compensation.

A description will now be given of the operation of the circuit shown in FIG. 3. When the switch 20b of the power suply circuit 20 is first closed, a DC voltage is supplied from the output terminal 20a of the power supply circuit 20 through the resistor 28 to the astable multivibrator circuit A which then starts its oscillation. Thus, the pulse signal described hereinabove with reference to FIG. 1 is produced at the output terminal 13 of the astable multivibrator circuit A. Accordingly, the first and second switching transistors 15 and 18 are switched on and off alternately or reciprocally. Thus, a predetermined DC voltage is obtained at the DC voltage output terminal 22, and a corresponding DC voltage from the rectifier circuit 23 is supplied to the voltage divider network.

When the voltage obtained at the DC output terminal 22 increases, for example, which may be attributed to various conditions, such as the fluctuation of the AC power source $20_{AC}$ of the power supply circuit 20 and the like, the voltage across the tertiary winding 19c of the transformer 19 also increases. Thus, the voltage supplied to the base electrode of the transistor 25 through the movable tap of the variable resistor 24b from the rectifier circuit 23 likewise increases. When the voltage supplied to the base electrode of the transistor 25 is increased, this higher voltage is compared wth the reference value obtained at the cathode electrode of the Zener diode 26. As a result, the voltage obtained at the collector electrode of the transistor 25 is reduced. This decreased collector voltage of the transistor 25 is applied to the connection point between the resistors 10 and 11 of the astable multivibrator circuit A. As a result, as described previously, the time during which the transistor 2 is conductive is shortened, and the time during which the transistor 2 is non-conductive is correspondingly lengthened. In other words, the astable multivibrator circuit A is controlled such that its oscillation frequency is constant but the duty ratio of the pulses produced thereby is changed. Thus, the time during which the first switching transistor 15 conducts is increased, and the time during which the second switching transistor 18 conducts is decreased. As a result, the DC voltage produced at the output terminal 22 is properly reduced and held constant.

As described above, when the "chopping" DC power source circuit uses the astable multivibrator circuit A of the present invention, as shown in FIG. 3, a constant voltage can always be maintained at the output terminal 22. Further, by adjusting the movable tap of the variable resistor 24b and hence adjusting the voltage at the connection point between the resistors 10 and 11, the pulse width of the pulses produced at the output terminal 13 of the astable multivibrator circuit A can be adjusted to change the DC voltage at the output terminal 22 to any desired value.

Further, by reason of the astable multivibrator circuit A which is used in the circuit shown in FIG. 3, the oscillation frequency of the astable multivibrator circuit A is kept substantially constant even when the DC voltage produced at the output terminal 22 is varied. Therefore, the problem of over-heating and damage to the switching transistor 15 and/or 18 and the transformer 17 and/or 19 is eliminated.

In addition, if the power supply circuit shown in FIG. 3 is used in a television receiver, the oscillation frequency of the astable multivibrator circuit can be set and held constant substantially at the horizontal scanning frequency. Therefore, the problem of deterioration or distortion of the quality of the picture reproduced on the screen of the cathode ray tube of the television receiver by undesirable radiation from the power supply circuit is avoided.

In the above embodiment, the bipolar transistors 1 and 2 are used as first and second active elements, but it may be understood that electron tubes, field effect transistors, switching devices and so on can be used in place of the transistors.

In the illustrated embodiment, the variable control DC voltage source 12 is connected to the connection point between the resistors 10 and 11. If desired, the DC voltage source can be replaced by a variable control DC current source with the same effect.

It may be apparent that many modifications and variations could be effected by one skilled in the art without departing from the spirit or scope of the novel concepts of the present invention, so that the scope of the invention should be determined by the appended claims.

I claim as my invention:

1. An astable multivibrator circuit comprising:
   A. first and second active elements each having control, common and output electrodes;
   B. first and second voltage terminals for connection to a power supply source;
   C. means for connecting said first voltage terminal to the output electrodes of said first and second active elements, respectively;
   D. means for connecting said second voltage terminal to the common electrodes of said first and second active elements, respectively; E. means including a first capacitor for connecting the output electrode of said first active element to the control electrode of said second active element;
   F. means including a unidirectional current conducting device and a second capacitor for connecting the output electrode of said second active element to the control electrode of said first active element;
   G. means for connecting a connection point between said second capacitor and the control electrode of said first active element to said first voltage terminal;
   H. a DC control voltage source for providing a DC control voltage;
   I. means for supplying said DC control voltage to the control electrode of said second active element;
   J. means for supplying said DC control voltage to a connection point between said unidirectional current conducting device and said second capacitor; and
   K. an output terminal connected to at least one of the output electrodes of said first and second active elements for deriving an output signal.

2. An astable multivibrator circuit according to claim 1, wherein said unidirectional current conducting device is a diode, said means for supplying said DC control voltage to the control electrode of said second active element includes a first resistor, and said means for supplying said DC control voltage to said connection point between said unidirectional current conducting device and said second capacitor includes a second resistor, said first and second resistors being connected in series between the control electrode of said second active element and the connection point between said diode and said second capacitor.

3. An astable multivibrator circuit according to claim 2, wherein said first and second active elements are first and second transistors respectively, and said control, common and output electrodes are base, emitter and collector electrodes of said transistor respectively.

4. An astable multivibrator circuit according to claim 3, wherein said DC control voltage source comprises converting means coupled to said output terminal for converting said output signal to a DC level; reference means for providing a predetermined reference level; and comparator means for comparing said DC level to said reference level and for producing said DC control voltage in accordance with the difference therebetween.

5. An astable multivibrator according to claim 4, wherein said output signal is a periodic pulse signal having variable pulse width and constant frequency, the pulse width being determined by the charging speed of said first capacitor and the discharging speed of said second capacitor, said charging and discharging speeds being simultaneously changed in the same direction by said DC control voltage; and said converting means comprises rectifier means for producing said DC level as a function of said pulse width.

6. An astable multivibrator circuit for producing an output periodic pulse signal of constant frequency and variable pulse width; comprising:
first and second switching means, each having conducting and non-conducting states and each including a control electrode for receiving a voltage which determines the state thereof and an output electrode for producing a signal representative of said state;
a first capacitor for coupling said output electrode of said first switching means to said control electrode of said second switching means and for applying a voltage to said control electrode of said second switching means;
a series circuit comprised of a unidirectional current conductor and a second capacitor for coupling said output electrode of said second switching means to said control electrode of said first switching means and for applying a voltage to said control electrode of said first switching means;
means for supplying an energizing voltage including means coupled to said second capacitor for charging same when said second switching means is in said conducting state;
a source of DC control voltage for providing a DC control voltage;
a charging circuit for supplying said DC control voltage to said first capacitor for charging said first capacitor to a voltage having a magnitude sufficient to switch said second switching means to its conducting state, the time required to so charge said first capacitor being determined by said DC control voltage; and
a discharging circuit for supplying said DC control voltage to said second capacitor for discharging said second capacitor concurrent with the charging of said first capacitor, said second capacitor being discharged to a level and at a rate determined by said DC control voltage, such that the time required to charge said second capacitor by said means for supplying an energizing voltage to a magnitude sufficient to switch said first switching means to its conducting state is determined by said DC control voltage.

7. An astable multivibrator circuit according to claim 6 wherein said unidirectional current conductor is a diode poled to permit said second capacitor to be charged only when said second switching means is conducting and to be discharged only through said first switching means.

8. An astable multivibrator circuit according to claim 6 wherein said means for supplying an energizing voltage comprises a source of energizing voltage; and first resistance means coupled between said source of energizing voltage and a junction formed between said second capacitor and said control electrode of said first switching means.

9. An astable multivibrator circuit according to claim 6 wherein said discharging circuit comprises second resistance means coupled between said source of DC control voltage and a junction formed between said second capacitor and said unidirectional current conductor, and including said source of DC control voltage, said second resistance means said second capacitor and said first switching means.

10. An astable multivibrator circuit according to claim 9 wherein said charging circuit comprises third resistance to claim 9 wherein said charging circuit comprises third resistance means coupled between said source of DC control voltage and a junction formed between said first capacitor and said control electrode of said second switching means.

* * * * *

UNITED STATES PATENT OFFICE
CERTIFICATE OF CORRECTION

Patent No. 3,956,713            Dated May 11, 1976

Inventor(s) Yoshiaki Ogawara

It is certified that error appears in the above-identified patent and that said Letters Patent are hereby corrected as shown below:

Column 1, line 10, change "adopted" to --adapted--,

Column 1, line 15, change "devises" to --devices--,

Column 1, line 17, change "includees" to --includes--,

Column 1, line 42, after "thereof" insert --.--,

Column 1, line 45, change "form" to --from--,

Column 2, line 14, change "c" to --C--,

Column 3, line 14, change "doide" to --diode--,

Column 3, line 39, change "aatt" to --at--,

Column 3, line 50, change "valve" to --value--,

Column 3, line 56, after "capacitor" insert --5--,

Column 4, line 16, change "loop" to --circuit--,

Column 4, line 29, change "thereby" to --whereby--,

Column 4, line 57, change "vcc" to --$V_{cc}$--,

UNITED STATES PATENT OFFICE
CERTIFICATE OF CORRECTION

Patent No. 3,956,713      Dated May 11, 1976

Inventor(s) Yoshiaki Ogawara

It is certified that error appears in the above-identified patent and that said Letters Patent are hereby corrected as shown below:

Column 4, line 64, change "$V'_o$" to --$V_o'$--,

Column 5, line 35, change "in" to --is--,

Column 5, line 38, change "non-concduction" to --non-conduction--,

Column 6, line 29, change "winging" to --winding--,

Column 7, line 9, delete "first",

Column 7, line 33, change "wth" to --with--,

Column 8, line 39, start new paragraph with "E.",

Column 10, line 43, after "means" insert --,--,

Column 10, line 46, delete "to claim 9 wherein said charging circuit com-"

Column 10, line 47, delete --prises third resistance"

Signed and Sealed this

First Day of February 1977

[SEAL]

Attest:

RUTH C. MASON
*Attesting Officer*

C. MARSHALL DANN
*Commissioner of Patents and Trademarks*